(12) United States Patent
Chen

(10) Patent No.: US 6,254,398 B1
(45) Date of Patent: Jul. 3, 2001

(54) METHOD FOR INITIATING A HELIUM ALARM PARTICLE DETECTOR IN A DRY ETCHING SYSTEM PRIOR TO INITIATION OF THE ETCHING PROCESS

(75) Inventor: Horng-Wen Chen, Taichung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/557,400

(22) Filed: Apr. 24, 2000

(51) Int. Cl.[7] .................................................. H01L 21/00
(52) U.S. Cl. ................. 439/9; 156/345; 216/59; 438/715; 438/710
(58) Field of Search ............................. 438/8, 9, 14, 710, 438/715, 735; 216/59, 60, 67, 84, 85; 156/345 MT, 345 P, 345 PT

(56) References Cited

U.S. PATENT DOCUMENTS

| | | | |
|---|---|---|---|
| 5,522,957 | 6/1996 | Weling et al. ...................... | 156/626.1 |
| 5,571,366 | * 11/1996 | Ishii et al. ........................... | 216/59 X |
| 5,888,579 | 3/1999 | Lun ........................................... | 427/8 |
| 6,060,329 | * 5/2000 | Kamata et al. ........................... | 438/9 |

* cited by examiner

Primary Examiner—William Powell
(74) Attorney, Agent, or Firm—George O. Saile; Stephen B. Ackerman

(57) ABSTRACT

A process for determining particles in a dry etching system, prior to performing the dry etching definition of a desired pattern, has been developed. The process features a two cycle, dry etching procedure, with the first cycle performed using a first set of dry etching conditions, not robust enough to result in etching of exposed material, but robust enough do allow the activation, and operation, of a backside helium alarm procedure, used to monitor particle count in the dry etching chamber, to be realized. If particle counts are acceptable a second cycle of the dry etching procedure, using a second set of dry etching conditions, is employed to define the desired pattern. If the particle counts observed via use of the backside helium alarm procedure during the non-etching, first cycle, are high, the dry etching procedure is interrupted. After cleanup of the dry etching chamber, the same samples, with a re-worked photoresist, are again subjected to the two cycle, dry etching procedure.

7 Claims, 1 Drawing Sheet

METHOD FOR INITIATING A HELIUM ALARM PARTICLE DETECTOR IN A DRY ETCHING SYSTEM PRIOR TO INITIATION OF THE ETCHING PROCESS

BACKGROUND OF THE INVENTION (1) Field of the Invention

The present invention relates to processes used to fabricate semiconductor devices, and more specifically to a process used to detect particles in a semiconductor fabrication tool, prior to operation of this tool.

(2) Description of Prior Art

Micro-miniaturization, or the ability to fabricate semiconductor devices comprised with sub-micron features, has been achieved via advances in specific semiconductor disciplines, such as photolithography and dry etching. The development of more advanced exposure cameras, as well as the use of more sensitive photoresist layers, have allowed sub-micron features to be achieved in photoresist layers. In addition the development of more advanced dry etching tools, and processes, have allowed the sub-micron features in the masking photoresist shapes to be successfully transferred to underlying materials, such as metal layers used for the interconnect structures of sub-micron, semiconductor devices. However the yield of semiconductor devices can be adversely influenced during the above patterning procedure, (photolithography and dry etching), due to the presence of unwanted particles present in the dry etching chamber. The particles in a dry etching chamber, in the form of polymer residues, formed during previous dry etching procedures, can settle on a exposed region of metal layer, masking this region during the dry etching procedure, resulting in bridging between subsequent, adjacent metal interconnect structures. In addition the unwanted particle can settle on the location of the electrostatic chuck, (ESC), of the dry etching tool, in which the semiconductor wafer is to be placed prior to etching. This in turn results in poor contact between the wafer and ESC, decreasing heat transfer from the wafer to the chuck, during the dry etching procedure, thus resulting in hot spots, or damage to the masking photoresist shape, again leading to unwanted metal interconnect patterns.

A majority of methods used to determine particle counts in a dry etching system can only be performed during the dry etching procedure, therefore only predicting metal interconnect yield loss during the etching cycle, but unable to alleviate the present situation. This is a result of a particle warning procedure only operational, when the plasma used to etch the exposed metal layers, gas already been generated. One such procedure of this type is a backside helium alarm system. With the type of procedure the wafers to be etched reside on openings in ESC, with helium fed to these openings allowing wafer cooling to be accomplished via heat transfer from the wafer backside to helium. If a particle were present on this portion of the ESC the wafer would not sit flush on the ESC, allowing helium to escape from the opening between the wafer and the ESC, resulting in the monitoring of helium in the dry etch chamber, and suggesting particle contamination in the dry etching tool. Unfortunately the procedure of introducing helium is only available in the presence of a plasma, which means that in addition to the indication of particles the dry etching procedure has already begun to define an unwanted metal interconnect pattern.

This invention will describe a backside helium alarm procedure in which only a first cycle of a dry etching procedure is needed to initiate the helium alarm procedure, with the first cycle comprised of dry etching conditions which do not initiate the definition of metal interconnect pattern. This allows the dry etching procedure to be suspended, during this non-etching, first cycle, allowing the desired metal interconnect pattern to be defined after particle cleanup, and possible photoresist rework. Prior art, such as Weiling et al, in U.S. Pat. No. 5,522,957, describe a method for leak detection, however that prior art does not describe the novel procedure used in the present invention of detecting particles in the dry etching system, in the presence of a mild plasma, however with the particle detection occurring prior to initiation of the metal interconnect definition procedure.

SUMMARY OF THE INVENTION

It is an object of this invention to detect particles in a dry etching chamber, prior to initiation of the patterning cycle of the dry etching procedure, with the wafers to be subsequently patterned, present in the dry etching system.

It is another object of this invention to initiate a backside helium alarm procedure during a first cycle of a dry etching procedure, using plasma conditions that allow the helium leak detection procedure to initiate, however without the removal or etching of the exposed portions of metal, not covered by a photoresist shape.

It is still another object of this invention to, after an acceptable dry etching chamber particle count, perform an in situ, second dry etching cycle, using plasma conditions that result in the desired patterning of a metal layer.

In accordance with the present invention a method of detecting particles in a dry etching tool via a backside helium alarm procedure, performed during a non-etching, first cycle of a dry etching procedure, followed by an in situ, second cycle of the dry etching procedure, used to define the desired metal interconnect pattern, is described. A semiconductor wafer comprised with a photoresist shape, overlying a metal layer, is placed on an electrostatic chuck, (ESC), of a dry etching system, with the wafer overlaying openings in the ESC, where the openings allow subsequent injection of helium to interface with the backside of the semiconductor wafer. A first cycle of the dry etching procedure, performed using plasma conditions that do not etch the exposed metal layer, is next employed, allowing initiation of the backside helium alarm procedure to be activated. If the backside helium alarm procedure indicates an absence of particles, an in situ, second cycle of the dry etching procedure is performed at plasma conditions that result in definition of the desired metal pattern. However if the backside helium alarm indicated particles, the dry etching cycle can be interrupted, followed by: system cleaning; photoresist re-work; and the re-start of the two cycle, dry etching procedure, featuring the backside helium alarm procedure.

BRIEF DESCRIPTION OF THE DRAWINGS

The object and other advantages of this invention are best described with reference to the attached drawing that includes.

DESCRIPTION OF THE PREFERRED EMBODIMENTS

Figure 1:
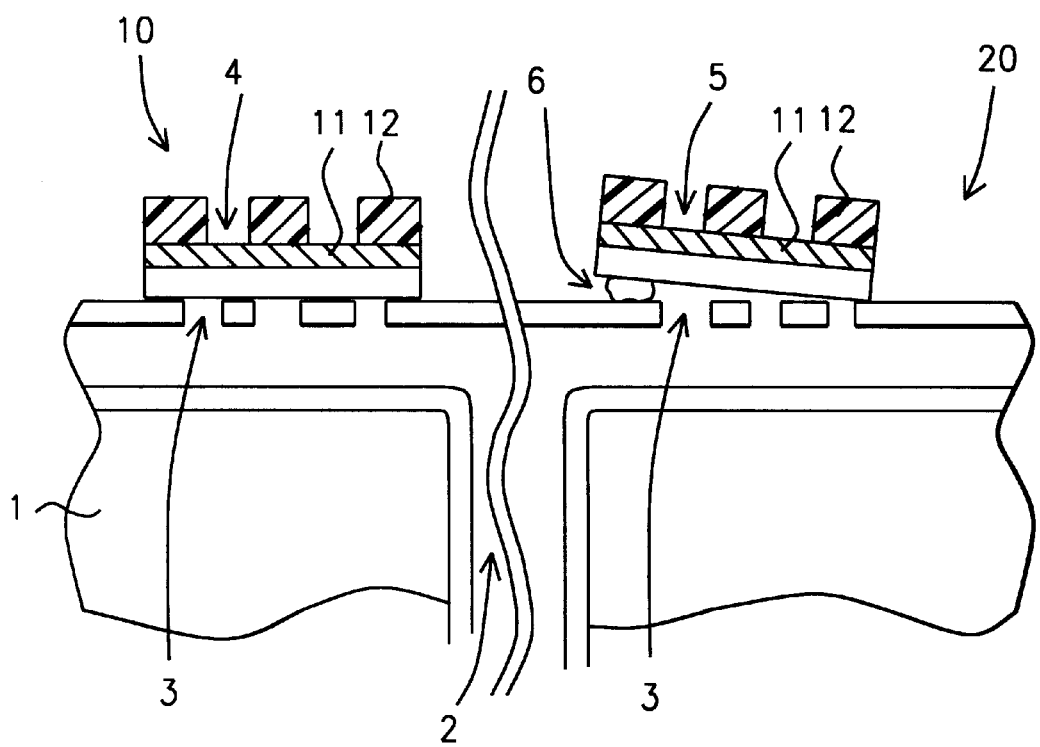
FIG. 1, which schematically shows a cross-sectional view of: a first wafer located, flush on a portion of an ESC, overlying the openings for helium injection, thus avoiding helium leaks; and a second wafer partially located on a particle, resulting in helium leaks, and detection via the backside helium alarm procedure.

The method of detecting particles in a dry etching tool via a backside helium alarm procedure, performed during a non-etching, first cycle of a dry etching procedure, followed by an in situ, second cycle of the dry etching procedure, used to define the desired metal interconnect pattern, will now be described in detail. FIG. 1, schematically shows a cross-sectional view, showing semiconductor wafer 4, in a single wafer chamber 10, of a dry etching tool, in which semiconductor wafer 4, sits flush on the top surface of electrostatic chuck 1. A helium inlet line 2, allows the flow of helium, and allows the helium gas to cool the backside of semiconductor wafer 4, via heat transfer from the backside of semiconductor wafer 4, via slots, or openings 3, in ESC 1. The helium flow can however only be initiated when a plasma is generated in chamber 10, accompanied by the injection the etching reactants, thus resulting in the patterning of metal layer 11, using overlying photoresist shape 12, as an etch mask. The situation displayed in chamber 10, of semiconductor wafer 4, sitting flush on ESC 1, results in an absence of helium leaking into the chamber. The example shown in chamber 20, however, shows semiconductor wafer 5, not sitting flush on ESC 1, as a result of an unwanted particle 6, located on the top surface of ESC 1. Particles can be present as a result of previous etching procedures, lacking proper maintenance of the dry etching tool. The generation of the plasma, and the introduction of the etching reactants, will initiate the introduction of helium, and for this case, result in helium leaking into chamber 20, and triggering the backside helium alarm. The backside helium alarm configuration is comprised of a series of valves, and a mass flow meter, (MFM). If the wafer sits flush with the bottom of the ESC a specific flow will pass through, and be monitored by the MMF. However if a particle does exist, not allowing the wafer to sit flush with the ESC, helium will escape, reducing the flow through the MFM. If the reduced flow through the MFM is greater than 0.20 sccm, an audio alarm, or response, occurs, allowing the cycle to be terminated and clean-up initiated.

The case shown for chamber 20, in FIG. 1, unfortunately can result in yield loss due to an unwanted metal pattern defined during this procedure. Since the backside helium alarm procedure is only activated with the generation of the plasma two unwanted phenomena can occur resulting in the defective metal pattern. First, the loss, or leaking of helium, as a result of particle 6, does not allow adequate cooling of semiconductor wafer 5, to be realized, possibly resulting in flowing or softening of photoresist shape 12. This in turn results in etching, or the transfer of the erroneous, masking photoresist shape to underlying metal layer 11. Secondly, the presence of particle 6, in an indication that other particles are likely to be present in chamber 20, with some particles possibly residing in the spaces of photoresist shape 12, resulting in a etched metal shape, exhibiting bridging. The situation shown in chamber 20, although activating the backside helium alarm indicating particles in the chamber, will however only indicate this situation after the etching procedure has progressed to a point in which re-work is not possible.

A solution enabling the use of the backside helium alarm procedure, without patterning of the metal layer, will now be described. This procedure can then allow re-work of unetched samples to be performed, since the backside helium alarm procedure was indicated prior to metal etching. After placement of a semiconductor wafer on ESC 1, a non-etching, first cycle of the dry etch procedure is initiated. The conditions used for the non-etching, first cycle, which most importantly initiated the helium flow, allowing the backside helium alarm procedure to be used is comprised of a source power between about 50 to 200 watts, a bias power, on the electrostatic chuck between about 1 to 5 watts; a pressure between about 5 to 7 mtorr; an argon flow between about 25 to 35 sccm; a flow of the etching $Cl_2$ reactant between about 80 to 100 sccm; and using a time period between about 5 to 20 sec. These conditions, specifically the low source and bias power, do not result in etching of exposed metal. However at these conditions the backside helium alarm procedure is operational, and therefore if helium leaking is detected, an indication of chamber particles, the first cycle can be terminated without etching of the underlying metal layer.

At this point, if the helium alarm procedure is not activated, a second cycle of the dry etching procedure is performed, using conditions comprising: a source power between 1500 to 1700 watts; a bias power between about 150 to 250 watts; a pressure between about 9 to 11 mtorr; an argon flow between about 25 to 35 sccm, a $Cl_2$ flow between about 80 to 100 sccm; for a time between about 90 to 110 sec. These conditions allow the desired metal pattern to be defined using the overlying photoresist shape as a mask, without interference from unwanted particles. If the first cycle resulted in triggering of the backside helium alarm, indicating an unacceptable particle count, the first cycle would be terminated, the etching chamber cleaned, the photoresist re-worked, and the unetched metal layer again subjected to the two cycle, dry etching procedure comprised of the non-etching, first cycle, used for particle detection, followed by the patterning, second cycle.

While this invention has been particularly shown and described with reference to, the preferred embodiments thereof, it will be understood by those skilled in the art that various changes in form and details may be made without departing from the spirit and scope of this invention

What is claimed is:

1. A method of performing a dry etching procedure, comprising a particle detection cycle, to define a pattern in a conductive layer on a semiconductor wafer, using photoresist as a mask, comprising the steps of:

providing a dry etching chamber comprised with an electrostatic chuck, (ESC), with openings in a portion of the top surface of said ESC, and with said openings connected to a helium source placing said semiconductor wafer, comprised with a photoresist pattern on an underlying conductive layer, on said portion of the top surface of said ESC;

performing a non-etching, first cycle of said dry etching procedure, at a first set of dry etching conditions, which initiates the flow of helium gas from said helium source, to said openings in said portion of the top surface of said ESC;

monitoring of said helium gas in said dry etching chamber, for said particle detection; and recording of an absence of helium gas in said dry etching system during said non-etching, first cycle of said dry etching procedure, perform an in situ, second cycle of said dry etching procedure, at a second set of conditions, resulting in definition of said pattern in said conductive layer.

2. The method of claim 1, wherein said first set of dry etching conditions, used for said non-etching, first cycle of said dry etching procedure is: a source power between about 50 to 200 watts; a bias power, on the electrostatic chuck between about 1 to 5 watts; a pressure between about 5 to 7 mtorr; an argon flow between about 25 to 35 sccm; a flow of the etching $Cl_2$ reactant between about 80 to 100 sccm, and performed for a time between about 5 to 20 sec.

3. A method of claim 1, wherein said second set of conditions, used for said second cycle of said dry etching procedure, used to define said pattern in said conductive layer is; a source power between 1500 to 1700 watts; a bias power between about 150 to 250 watts; a pressure between about 9 to 11 mtorr; an argon flow between about 25 to 35 sccm; a $Cl_2$ flow between about 80 to 100 sccm; performed for a time between about 90 to 110 sec.

4. A method of using a two cycle, dry etching procedure, to define a metal pattern on a semiconductor wafer, with a backside helium alarm procedure, used to detect particles in a dry etching chamber, during a non-etching, first cycle of said dry etching procedure, comprising the steps of:

provide said dry etching chamber comprised with an electrostatic chuck, (ESC), featuring openings in a portion of said ESC, allowing helium gas to flow from a helium source to said openings;

placing said semiconductor wafer, comprised with a photoresist pattern on underlying metal layer, on the portion of said ESC, comprised with said openings;

initiating said non-etching, first cycle of said dry etching procedure, using a first set of dry etching conditions, and initiating a flow of helium gas, activating said backside helium alarm procedure;

performing an in situ, second cycle of said dry etching procedure, using a second set of conditions, only performed if said backside helium alarm system did not detect said helium gas in said dry etching chamber, with said in situ, second cycle of said dry etching procedure resulting in definition of said metal pattern on said semiconductor wafer; and terminating said non-etching, first cycle of said dry etching procedure, if said backside helium alarm system does detect said helium gas in said dry etching chamber, followed by: particle clean-up of said dry etching chamber; re-working of said photoresist pattern; and restarting said non-etching, first cycle of said dry etching procedure.

5. The method of claim 4, wherein said first set of conditions, used for said non-etching, first cycle of said dry etching procedure are: a source power between about 50 to 200 watts; a bias power, on the electrostatic chuck between about 1 to 5 watts; a pressure between about 5 to 7 mtorr; an argon flow between about 25 to 35 sccm; a flow of the etching $Cl_2$ reactant between about 80 to 100 sccm; performed for a time period between about 5 to 20 sec.

6. The method of claim 4, wherein said first cycle, of said dry etching procedure is terminated when backside helium alarm procedure experiences a loss of flow greater than 0.20 sccm, monitored by a mass flow meter.

7. A method of claim 4, wherein said second set of conditions, used for said second cycle of said dry etching procedure, used to define said pattern in said conductive layer is: a source power between 1500 to 1700 watts; a bias power between about 150 to 250 watts; a pressure between about 9 to 11 mtorr; an argon flow between about 25 to 35 sccm; a $Cl_2$ flow between about 80 to 100 sccm; performed for a time between about 90 to 110 sec.

* * * * *